United States Patent [19]
Tamai

[11] Patent Number: 6,037,702
[45] Date of Patent: Mar. 14, 2000

[54] VIBRATING ACTUATOR

[75] Inventor: Jun Tamai, Yokohama, Japan

[73] Assignee: Canon Kabushiki Kaisha, Tokyo, Japan

[21] Appl. No.: 09/119,730

[22] Filed: Jul. 21, 1998

[30] Foreign Application Priority Data

Jul. 28, 1997 [JP] Japan .................................. 9-201371

[51] Int. Cl.⁷ .................................................. H02N 2/00
[52] U.S. Cl. .................... 310/323.06; 310/328; 310/365; 310/366
[58] Field of Search ................................. 310/366, 328, 310/365, 323.09, 323.13, 323.06

[56] References Cited

U.S. PATENT DOCUMENTS

| 3,270,330 | 8/1966 | Weinberg | 310/328 |
| 4,317,093 | 2/1982 | Lungo | 310/328 |
| 4,672,257 | 6/1987 | Oota et al. | 310/328 |
| 5,122,700 | 6/1992 | Tamai et al. | 310/323 |
| 5,124,611 | 6/1992 | Tamai et al. | 310/317 |
| 5,231,325 | 7/1993 | Tamai et al. | 310/323 |
| 5,440,190 | 8/1995 | Imabayashi et al. | 310/323.09 |
| 5,506,462 | 4/1996 | Tamai et al. | 310/328 |
| 5,548,175 | 8/1996 | Tamai | 310/323 |
| 5,574,326 | 11/1996 | Chiba et al. | 310/323 |
| 5,594,291 | 1/1997 | Tamai et al. | 310/323 |
| 5,600,196 | 2/1997 | Tamai | 310/323 |
| 5,684,353 | 11/1997 | Fujimoto | 310/323 |
| 5,705,880 | 1/1998 | Shimura et al. | 310/366 |
| 5,760,529 | 6/1998 | Tamai et al. | 310/323 |

FOREIGN PATENT DOCUMENTS 2-94488  7/1990  Japan ................................ H02N 2/00

*Primary Examiner*—Thomas M. Dougherty
*Attorney, Agent, or Firm*—Fitzpatrick, Cella, Harper & Scinto

[57] ABSTRACT

A vibrating actuator including a vibration member having an electro-mechanical energy conversion element and an electrode member for feeding an electrical signal to the electro-mechanical energy conversion element, a contact body, in press contact with the vibration member, for moving relative to the vibration member, and a case. The electrode member includes projecting portion in press contact with an electrically conductive member mounted on the case thereby to form an electrical connection therewith.

13 Claims, 5 Drawing Sheets

VIBRATING ACTUATOR

BACKGROUND OF THE INVENTION

1. Field of the Invention

The present invention relates to a vibrating actuator such as an ultrasonic motor.

2. Description of the Related Art

One vibrating actuator such as a conventional ultrasonic motor is disclosed in Japanese Utility Model Laid-Open No. 2-94488, for example, as shown in FIGS. 6–8. In a bar-type vibrating actuator, electric-energy-to-mechanical-energy converting elements (electro-mechanical energy conversion elements) such as piezoelectric elements (1a and 1b) and electrode plates for feeding power to the piezoelectric elements are arranged between a pair of elastic bodies (a front vibrator 3 and a rear vibrator 4), and the pair of elastic bodies are clamped with clamping members. The vibrating actuator comprises a vibration member in which the piezoelectric elements and the electrode plates are interposed between the pair of elastic members and a contact body (movable body 6) that is pressed into contact with one of the elastic bodies. The contact body is driven by either a combination of a vertical vibration motion along the longitudinal axis of the vibration member and a torsional vibration motion about the longitudinal axis or a composition of bending vibration motions of the vibration member having different phases.

A flexible printed circuit board (2) is used to feed an alternating current signal such as an alternating current voltage from a drive control circuit to the piezoelectric elements of the vibration member. Input terminals (2a–2c) connected to the electrode plates arranged in the vibration member are constructed of the flexible printed circuit board, and the flexible printed circuit board (2) is interposed between the elements of the vibration member. Lead portions of the flexible printed circuit board (2) are bent to run along the circumferential surfaces of the vibration member elements.

When the flexible printed circuit board is bent, a stress takes place at its bent portion. The vibration of the vibration member occasionally breaks the flexible printed circuit board at its bent portion.

If the curvature of the bent portion is increased to reduce the stress taking place at the bent portion, the overall diameter of the actuator including the flexible printed circuit board becomes larger.

SUMMARY OF THE INVENTION

According to one aspect of the present invention, a vibrating actuator comprises a vibration member having an electrical-energy-to-mechanical-energy converter element and an electrode member for feeding an electrical signal to said electrical-energy-to-mechanical-energy converter element, a contact body, in contact with said vibration member, for moving relative to the vibration member, and a casing, wherein the electrode member of the vibration member includes a projecting portion, and wherein an electrically conductive member, mounted on the casing, is provided in press contact with the projecting portion of said electrode member to form an electrical connection.

DESCRIPTION OF THE PREFERRED EMBODIMENTS

First Embodiment

Figure 1:
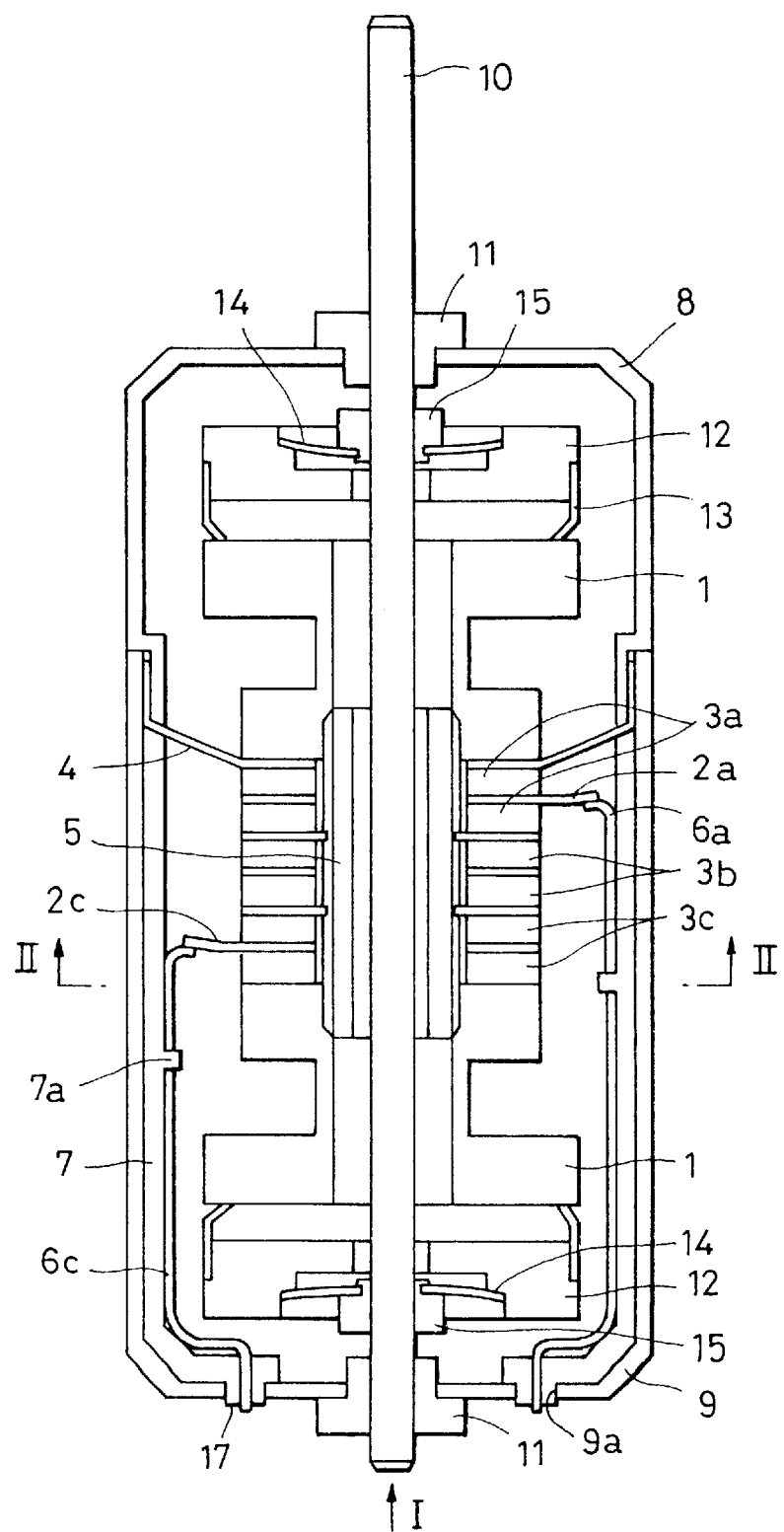
FIG. 1 is a sectional view showing an actuator according to a first embodiment of the present invention.
Figure 2A:
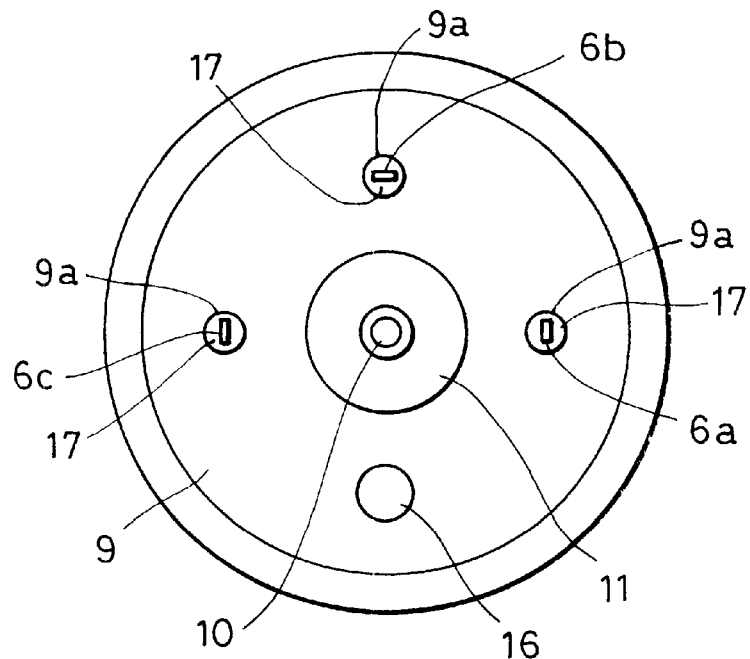
FIG. 2A is an end view of the actuator viewed from an arrow I in FIG. 1 and FIG. 2B are cross-sectional view taken along arrows II—II in FIG. 1.
Figure 2B:
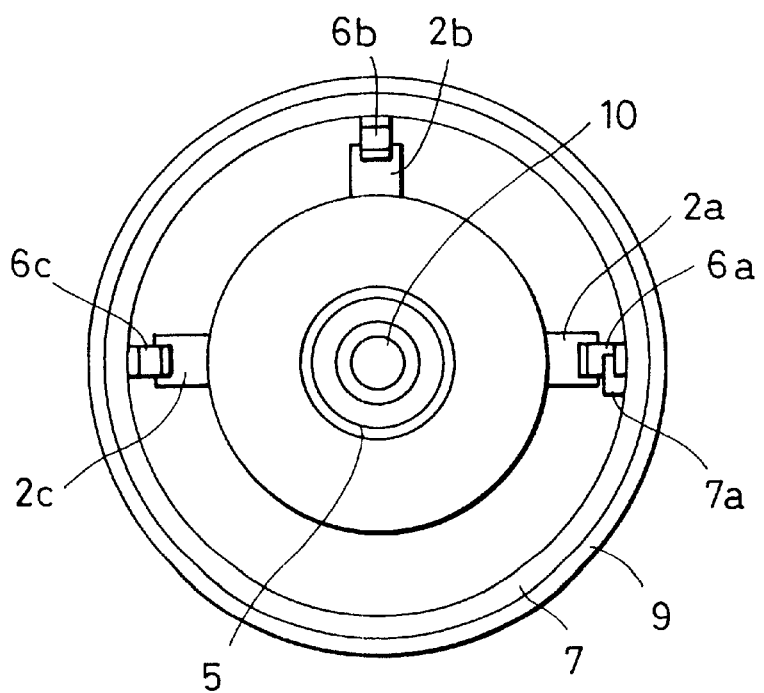

FIGS. 1, 2A and 2B show a first embodiment of a bar-type ultrasonic motor which implements the present invention.

The bar-type ultrasonic motor of this embodiment is housed in upper and lower case portions 8 and 9. A vibration member arranged in the center of the case 8 and 9 comprises two elastic bodies 1, electrode plates 2a, 2b and 2c, piezoelectric elements (pairs) 3a, 3b and 3c, and a support member 4. The components constituting the vibration member have through-holes in their respective axial centers and are secured together by a hollow bolt 5 which is screwed into internal threads of the two elastic bodies 1. The hollow bolt 5 has an external thread on its outer circumferential surface which is screwed into internal threads of the elastic bodies 1 to connect the two elastic bodies 1.

An output shaft 10 runs through the hollow portion formed along the central axis of the hollow bolt 5. The output shaft 10 is supported by bearings 11 that are press-fitted into the top and bottom portions of the respective case portions 8 and 9. The case portions 8 and 9 are thus substantially sealed.

The ultrasonic motor of this embodiment has two movable bodies (contact bodies) 12 at respective axial ends of the vibration member and a clamping member 15 integral with a spring washer 14 is press-fitted around the output shaft 10 in the vicinity of each movable body 12. By adjusting the press-fit position of the clamping member 15 relative to the output shaft 10, the spring washer 14 exerts pressure on a friction member 13, having a spring feature, arranged on the end of the movable body 12 against the elastic body 1. Since a rotation stopper, though not shown, is provided between the spring washer 14 and the movable body 12, the two components rotate integrally.

The vibration member combines two bending vibrations having different phases when driving piezoelectric elements 3a and 3b are supplied with alternating signals by an unshown drive control circuit, and moves like a rope in a skipping-rope motion. Any given point on the end surface of the vibration member moves in a circular or elliptical motion, and imparts a rotary force to the friction member 13 of the movable body 12 pressed into contact with the end surface of the vibration member. Since the friction member 13 is fitted into the movable body 12, the movable body 12 also rotates. The principle of the ultrasonic motor is known as disclosed in U.S. Pat. No. 5,548,175, and the discussion in detail about it is omitted here. The present invention is not limited to a driving method using a composition of two bending vibrations, as used in this embodiment. Alternatively, a driving method using a composition of a vertical vibration and a torsion vibration may be used.

The outer circumference of a generally cylindrical support member 4 clamped in the vibration member is welded to the junction between the case portions 8 and 9. Although the support member 4 is designed to support the vibration member, it also has a structure that facilitates generation of the vibration of the vibration member; for example, the support member 4 provides a high rigidity about the axis but permits some degree of flexibility of the axis in a radial direction.

Electrode plates interposed between piezoelectric elements 3a, 3b and 3c have respective terminal portions 2a, 2b, and 2c projecting radially out from the outer diameter of the piezoelectric elements. These terminal portions 2a, 2b, and 2c extend radially, and are angularly shifted respective to each other around the axis so that they are not aligned in the axial direction, as shown in FIG. 2B. FIG. 2B is a cross-sectional view taken along a line II—II in FIG. 1, and the three electrode plate terminal portions 2a, 2b, and 2c extending from the vibration member are angularly spaced at 0°, 90° and 180° in this embodiment. Alternatively, the three electrode plate terminal portions 2a, 2b, and 2c may be equally angularly spaced by 120°. The terminal portions 2a, 2b, and 2c are pressed, in the axial direction, into contact with conductive metal members 6a, 6b, and 6c arranged in the lower case portion 9 for electrical connection.

The conductive metal members 6a, 6b, and 6c are secured to an insulating resin member 7 by means of hooks 7a arranged within the lower case portion 9. The insulating resin member 7 has a cup-like shape with an open bottom, and is secured within the lower case portion 9 with locating projections 17 on its bottom side received in holes 9a of the lower case portion 9.

Ends of the conductive metal members 6a, 6b, and 6c run to the end of lower case portion 9, so that the ends may be connected to lead wires or a flexible printed circuit board (not shown), to feed a required power (electrical signal) to the motor.

To assemble the motor of this embodiment, the vibration member, the movable bodies 12 and the output shaft 10, all of which are pre-assembled, are together fitted into the upper case portion 8 having a bearing 11. On the other hand, a bearing 11, the insulating resin member 7 and the conductive metal members 6a, 6b and 6c are assembled into the lower case portion 9.

When the upper case portion 8 having the required components assembled therein is finally mated with the lower case portion 9 having the required components assembled therein, the assembly of the motor is completed with the electrode plate terminal portions 2a, 2b, and 2c respectively pressed into contact with the conductive metal members 6a, 6b, and 6c at a pressure sufficient to maintain good electrical contact therebetween.

The upper case portion 8 and the lower case portion 9 are secured to each other using an adhesive agent. Alternatively, electric-resistance welding, laser welding, or brazing may be used. The two case portions 8 and 9 may be manufactured using a press draw forming technique, and then connected with their joints mutually caulked. Alternatively, the case portions themselves may be constructed of an insulating resin, thereby dispensing with the need to provide insulating resin member 7.

FIG. 2A is a view of the motor viewed from the arrow I.

The three terminals of the conductive metal terminal portions 6a, 6b, and 6c and a common electrode terminal 16 (for ground) are projected out of the end face of the motor. The terminal 16 is connected to the lower case portion 9, and is thus maintained at the same potential as that of the lower case portion 9.

Since the lower case portion 9 is metallic in this embodiment of the present invention, it is electrically conductive. The lower case portion 9 remains in contact with the support member 4, and is at the same potential as that of the elastic bodies 1 and the hollow bolt 5.

The two metal conductive members 6a, 6b feed power to the pair of piezoelectric elements 3a to generate in them a bending vibration in one direction, and feed power to the pair of piezoelectric elements 3b to generate in them a bending vibration perpendicular to the one direction.

The conductive member 6c is used to detect a voltage generated by the pair of piezoelectric elements 3c, thereby to detect the vibration state of the vibration member.

In the conventional ultrasonic motor, one movable body is arranged for one vibration member. In this embodiment, however, two movable bodies 12 are provided on respective sides of the vibration member. Since the two movable bodies are also coupled to the same output shaft, the following advantages are provided in comparison with a motor with one movable body.

1) The starting torque is doubled. Although the friction limits the pressure working between the vibration member and the movable body, the output shaft generates a torque twice as strong as that of a conventional art motor if the pressures are equal.

2) Irregular rotation is reduced. Irregular rotation is attributed to an unstable contact condition on the contact area. The unstable contact conditions are caused by an insufficient flatness of a friction surface or an insufficient roundness (eccentricity) of the vibration of the vibration member with respect to the axis. Since these factors are chiefly attributed to machining accuracy, they are inevitable to some degree. When the two movable bodies are employed, however, the unstable contact conditions cancel out each other, and the irregular rotation is thus reduced.

3) A decreased internal loss in the vibration member results in an improved motor efficiency. When only a single movable body is used, one end of the vibration member with no movable body pressed against it moves freely, and the resultant vibration attenuation thereby consumes energy. Suppose that a motor with two movable bodies generates power twice as high as a motor with a single movable body. This case may be interpreted as identical to the case in which torque is doubled with the rotational speed remaining unchanged. The internal losses in the two vibration members are equal to each other. Thus, the overall efficiency is increased.

Second Embodiment

Figure 3:
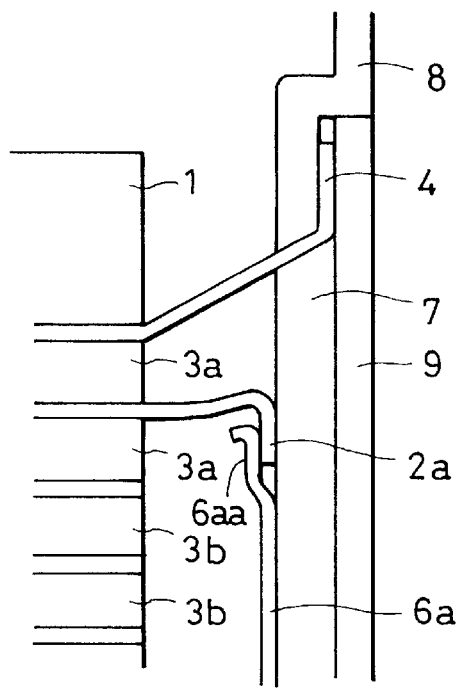
FIG. 3 is a sectional view showing a portion of a ultrasonic motor according to a second embodiment of the present invention.

FIG. 3 shows a second embodiment of the present invention.

The second embodiment is almost identical to the first embodiment in construction, and the difference therebetween is discussed below.

In the second embodiment, the terminal portions 2a, 2b and 2c of the electrode plates are bent approximately at a right angle, in the axial direction.

The contact portions of the conductive metal members 6a, 6b, and 6c have a step portion (see, e.g., 6aa in FIG. 3) so that a gap is provided between the conductive metal member and the insulating resin member 7. The gap between each of the conductive metal members 6a, 6b, and 6c and the insulating metal member 7 receives a respective one of the terminal portions 2a, 2b, and 2c in the axial direction.

To assemble the motor of the second embodiment, the assembled vibration member and the support member 4 are fitted into the upper case portion 8. The conductive metal members 6a, 6b, and 6c are attached to the insulating resin member 7. The insulating resin member 7 is then secured into the lowers case portion 9. Finally, the upper case portion 8 with the conductive metal members 6a, 6b, and 6c and the insulating resin member 7 mounted therein is mated with the lower case portion 9 with the support member 4 clamped therebetween. The assembly of the motor is now completed.

Each of the terminal ends of the electrode plates 2a, 2b, and 2c is clamped between a respective one of the conductive metal members 6a, 6b, and 6c and the insulating resin member 7 to provide electrical connection therebetween.

Since the terminal ends of the electrode plates 2a, 2b and 2c are clamped against the insulating resin members 7 by the recovering force of the conductive metal members 6a, 6b and 6c in the second embodiment, the electrode plates are free from unstable electrical contact even under vibration conditions, and the electrical connection is reliably maintained.

Third Embodiment

Figure 4A:
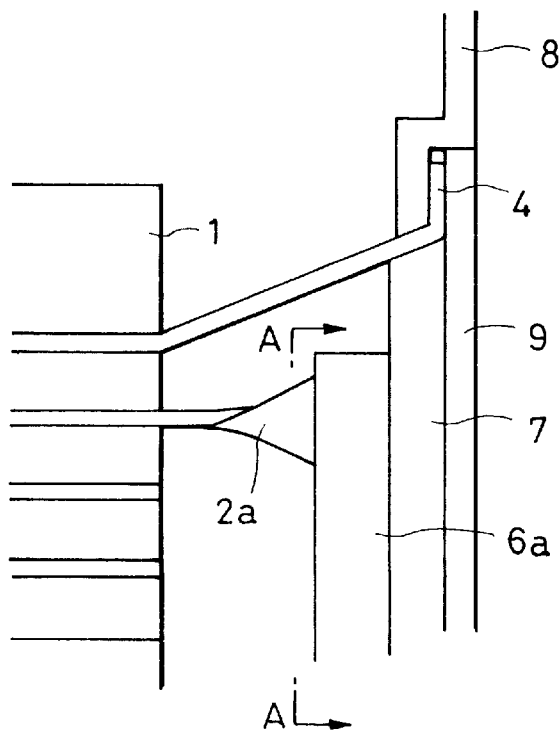
FIG. 4A is a sectional view showing a portion of a ultrasonic motor according to a third embodiment of the present invention.
Figure 4B:
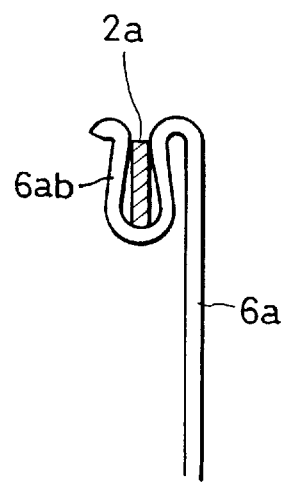
FIG. 4B is a side view showing a portion of the ultrasonic motor.

FIGS. 4A and 4B show a third embodiment of the present invention.

The third embodiment is almost identical in construction to the first embodiment shown in FIG. 1, and the difference therebetween is discussed below.

In the third embodiment, the terminal portions of the electrode plates 2a, 2b, and 2c extending from the vibration member respectively are twisted by 90° so that their width section is aligned in the axial direction. To receive these terminal portions, the end portions of the conductive metal members 6a, 6b, and 6c are bent to form a socket portion U-shaped in cross section (see end portion 6ab in FIG. 4B). The terminal portions of the electrode plates 2a, 2b, and 2c are inserted in the axial direction and maintained in press contact in the socket portions.

When the lower case portion 9 is mated with the upper case portion 8 in the third embodiment, the terminal portions of the electrode plates 2a, 2b and 2c are reliably clamped in the conductive metal plates 6a, 6b, and 6c, respectively. By twisting the electrode plate terminal portions by 90°, their rigidity in the axial direction is increased.

Fourth Embodiment

Figure 5A:
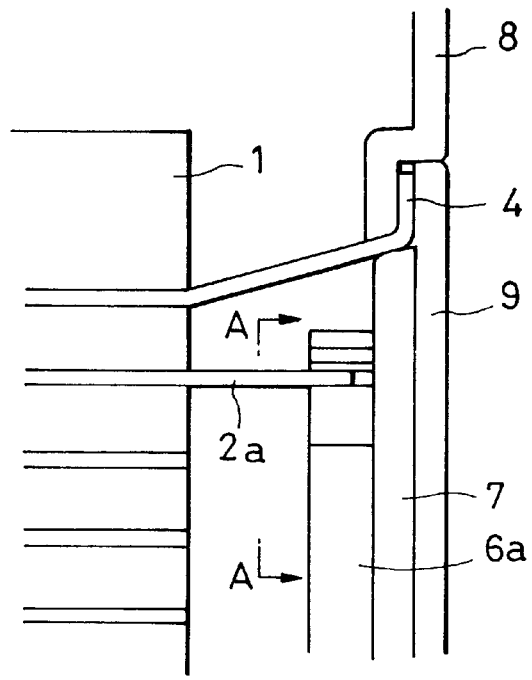
FIG. 5A is a sectional view showing a portion of a ultrasonic motor according to a fourth embodiment of the present invention.
Figure 5B:
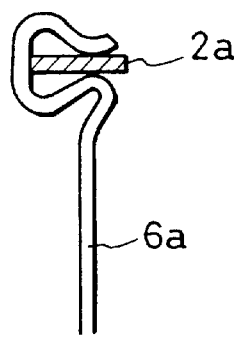
FIG. 5B is a side view showing a portion of the ultrasonic motor.
Figure 6:
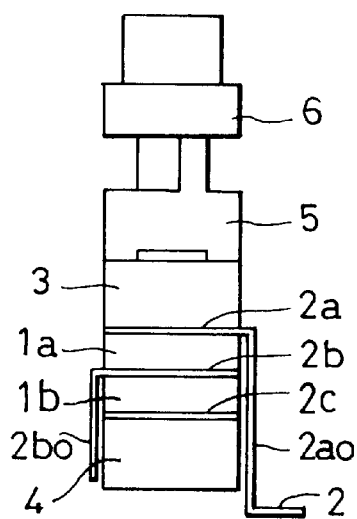
FIG. 6 is a front view of a conventional ultrasonic motor.
Figure 7:
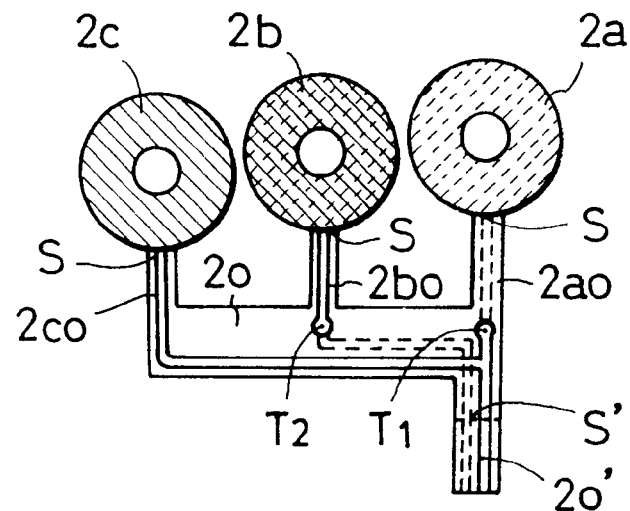
FIG. 7 is a developed view of a power feeding flexible printed circuit board for the conventional ultrasonic motor.
Figure 8:
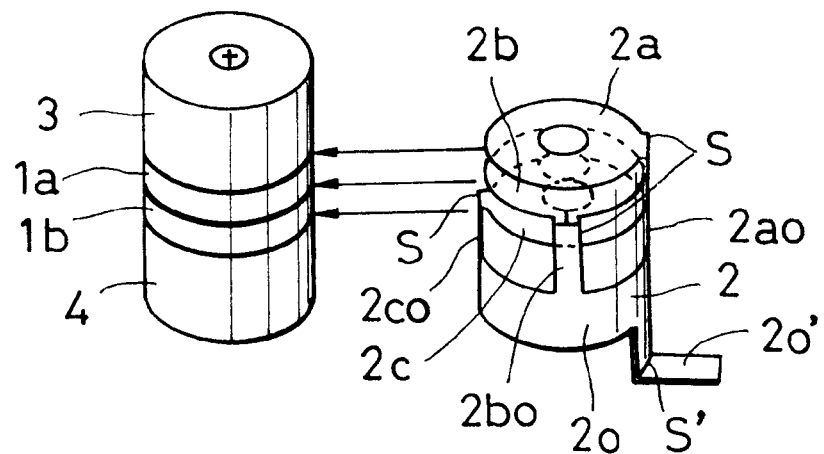
FIG. 8 is a perspective view showing the conventional ultrasonic motor with the power feeding flexible printed circuit board mounted thereon.

FIGS. 5A and 5B show a fourth embodiment of the present invention.

The fourth embodiment is almost identical in construction to the first embodiment shown in FIG. 1, and the difference therebetween is discussed below.

In the fourth embodiment, the electrode plate terminal portions 2a, 2b, and 2c extend radially in the same manner as in the first embodiment, and the end portions of the conductive metal members 6a, 6b, and 6c are formed with a socket portion U-shaped in cross section and extending in a circumferential direction around the vibration member inside the insulating resin member 7, as shown in FIG. 5A.

In the fourth embodiment, after the lower case portion 9 is connected to the upper case portion 8, the lower case portion 9 is rotated about its own axis so that the electrode plate terminal portions 2a, 2b, and 2c are inserted into and then press contacted to the respective socket portions to obtain electrical connection therebetween.

In the above embodiments, the movable body (contact body) 12 is designed to rotate relative to the vibration member. The present invention is not limited to this arrangement. Alternatively, the vibration member and the contact body may be moved relative to each other in a manner such that the vibration member moves relative to the contact body.

In the above embodiments, as described above, the conductive metal members 6a, 6b and 6c, separate from the electrode plates, are mounted on the lower case portion 9, and the terminal portions of the electrode plates 2a, 2b and 2c are arranged in press contact with the conductive metal members. The above arrangement provides the following advantages.

1) The assembly of the vibrating actuator is easy.

2) Since the separate members are employed where the stress in the electrode plates is at its maximum, damage to the electrode plates is prevented, and a reliable vibrating actuator results.

3) The use of conductive metal members secured to the case by means of another member shortens the terminal portions of the electrode plates projecting out of the vibration member. As a result, the natural frequency of each terminal portion is raised, lowering the possibility that the terminal portion will vibrate and generate sound.

4) Since each terminal portion is shortened as described above, a case having a small diameter may be used to obtain a small outer diameter of the vibration member. This accordingly reduces the diameter of the vibrating actuator.

5) The conductive metal members, secured to the case, are reliably held without aging and reliably feed power to the vibration member elements.

While the present invention has been described with respect to what is presently considered to be the preferred embodiments, it is to be understood that the invention is not limited to the disclosed embodiments. To the contrary, the present invention is intended to cover various modifications and equivalent arrangements and structures included within the spirit and scope of the appended claims. The scope of the following claims is to be accorded the broadest interpretation so as to encompass all such modifications and equivalent structures and functions.

What is claimed is:

1. A vibrating actuator comprising:
   a vibration member including an electro-mechanical energy conversion element and an electrode member for feeding an electrical signal to said electro-mechanical energy conversion element to generate a vibration in said vibration member, said electrode member having a projecting portion;
   a contact body press contacted to said vibration member, said contact body moving relative to said vibration member in response to the vibration generated in said vibration member;
   a case that houses said vibration member and said contact body; and
   an electrically conductive member mounted on said case and press contacted to the projecting portion of said electrode member, thereby forming electrical connection therewith.

2. A vibrating actuator according to claim 1, wherein said electrode member has a plate-like structure.

3. A vibrating actuator according to claim 1, wherein said projecting portion of said electrode member is bent to extend in the direction of a longitudinal axis of said vibration member.

4. A vibrating actuator according to claim 1, wherein a terminal end of said projecting portion of said electrode member is twisted to align said terminal end widthwise in an axial direction of said vibration member.

5. A vibrating actuator according to claim 1, wherein said electrically conductive member has a socket portion into which said projecting portion of said electrode member is inserted.

6. A vibrating actuator according to claim 5, wherein said socket portion is open in a circumferential direction.

7. A vibrating actuator according to claim 1, further comprising a plurality of electrode members which are angularly shifted relative to each other in a circumferential direction around said vibration member.

8. A vibrating actuator according to claim 1, further comprising an insulating member clamped between said electrically conductive member and said case, and wherein said case is electrically conductive.

9. A vibrating actuator according to claim 1, further comprising an output shaft and a bearing for rotatably supporting said output shaft coaxially with said vibration member, and wherein said case is cylindrical, and said case is substantially sealed by said bearing.

10. A vibrating actuator according to claim 1, wherein through-holes are formed in the axial centers of said vibration member and said contact body, wherein said output shaft is inserted through the through-holes of said vibration member and fixed to said contact body for coaxial rotation therewith, and wherein part of said output shaft projects out of said case.

11. A vibrating actuator according to claim 10, further comprising a bearing fitted into an axial hole of said case, wherein said output shaft is rotatably supported by said bearing, and wherein said case is substantially sealed.

12. A vibrating actuator according to claim 1, further comprising:

a second contact body, said contact body and said second contact body being arranged at respective axial ends of said vibration member; and an output shaft secured to said contact body and said second contact body.

13. A vibrating actuator according to claim 12, further comprising first and second bearings arranged at respective axial ends of said case, and wherein said output shaft is supported by first and second bearings.

* * * * *